(12) United States Patent
Tsukada et al.

(10) Patent No.: US 8,710,374 B2
(45) Date of Patent: Apr. 29, 2014

(54) PRINTED WIRING BOARD WITH REINFORCED INSULATION LAYER AND MANUFACTURING METHOD THEREOF

(75) Inventors: Kiyotaka Tsukada, Ogaki (JP); Takamichi Sugiura, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 538 days.

(21) Appl. No.: 12/360,181

(22) Filed: Jan. 27, 2009

(65) Prior Publication Data

US 2009/0229868 A1 Sep. 17, 2009

Related U.S. Application Data

(60) Provisional application No. 61/035,951, filed on Mar. 12, 2008.

(51) Int. Cl.
 *H05K 1/02* (2006.01)
(52) U.S. Cl.
 USPC .......................................................... 174/258
(58) Field of Classification Search
 USPC .................................................. 174/258, 264
 See application file for complete search history.

(56) References Cited

U.S. PATENT DOCUMENTS

| | | | |
|---|---|---|---|
| 6,038,133 A | 3/2000 | Nakatani et al. | |
| 6,370,013 B1 | 4/2002 | Iino et al. | |
| 6,724,638 B1 | 4/2004 | Inagaki et al. | |
| 6,930,258 B1 * | 8/2005 | Kawasaki et al. | 174/264 |
| 2005/0039948 A1 | 2/2005 | Asai et al. | |
| 2006/0191711 A1 | 8/2006 | Cho et al. | |
| 2007/0221400 A1 * | 9/2007 | Kurashina et al. | 174/255 |
| 2007/0227765 A1 | 10/2007 | Sakamoto et al. | |
| 2009/0008765 A1 | 1/2009 | Yamano et al. | |
| 2009/0096095 A1 * | 4/2009 | Ishido | 257/737 |
| 2009/0218672 A1 * | 9/2009 | Nakamura et al. | 257/690 |
| 2010/0101843 A1 * | 4/2010 | Wakabayashi et al. | 174/258 |
| 2010/0113264 A1 * | 5/2010 | Tsurumi et al. | 502/402 |

FOREIGN PATENT DOCUMENTS

| | | |
|---|---|---|
| JP | 05-037151 | 2/1993 |
| JP | 5-198953 A | 8/1993 |
| JP | 11-220262 | 8/1999 |
| JP | 2002-134920 A | 5/2002 |
| JP | 2002-261432 A | 9/2002 |
| JP | 2004-238610 A | 8/2004 |
| JP | 2005-82742 A | 3/2005 |
| JP | 2005-330401 A | 12/2005 |
| JP | 2007-019267 A | 1/2007 |
| JP | 2007-049004 A | 2/2007 |
| JP | 2007-088009 A | 4/2007 |
| JP | 2008-010885 A | 1/2008 |
| WO | WO 2004/089048 A1 | 10/2004 |
| WO | WO 2005/104635 A1 | 11/2005 |

* cited by examiner

*Primary Examiner* — Chau Nguyen
(74) *Attorney, Agent, or Firm* — Oblon, Spivak, McClelland, Maier & Neustadt, L.L.P.

(57) ABSTRACT

A printed wiring board is manufactured by a method in which a core substrate having an insulation substrate and a conductive circuit formed on the insulation substrate is provided. An inner insulation layer is formed on the core substrate, and a surface of the inner insulation layer is treated to form a roughened portion on the surface. An outer insulation layer including a reinforcing material is formed on the surface of the inner insulation layer having the roughened portion.

21 Claims, 13 Drawing Sheets

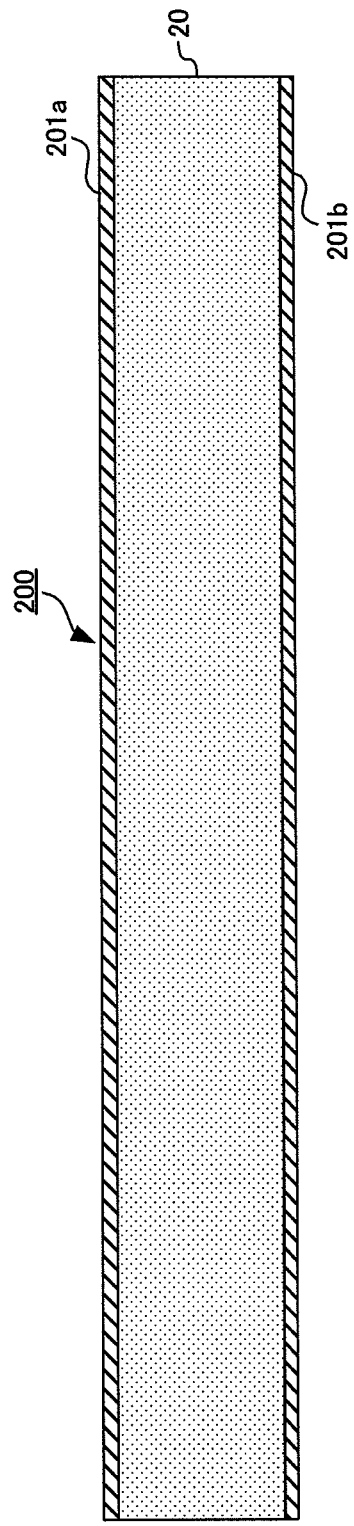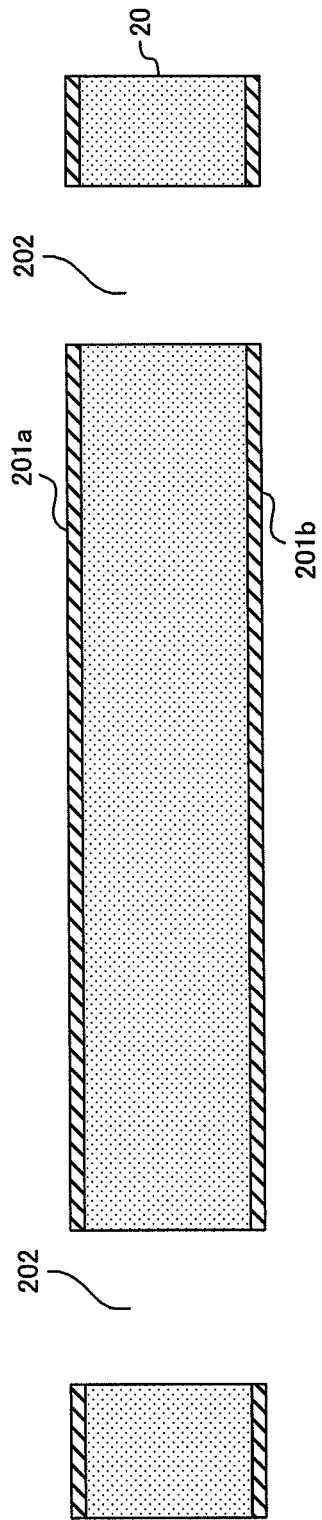

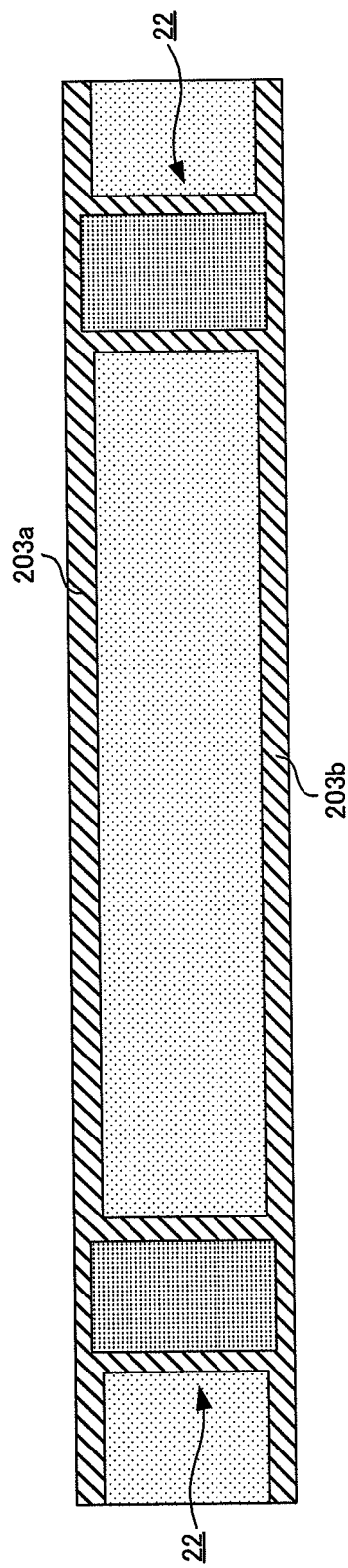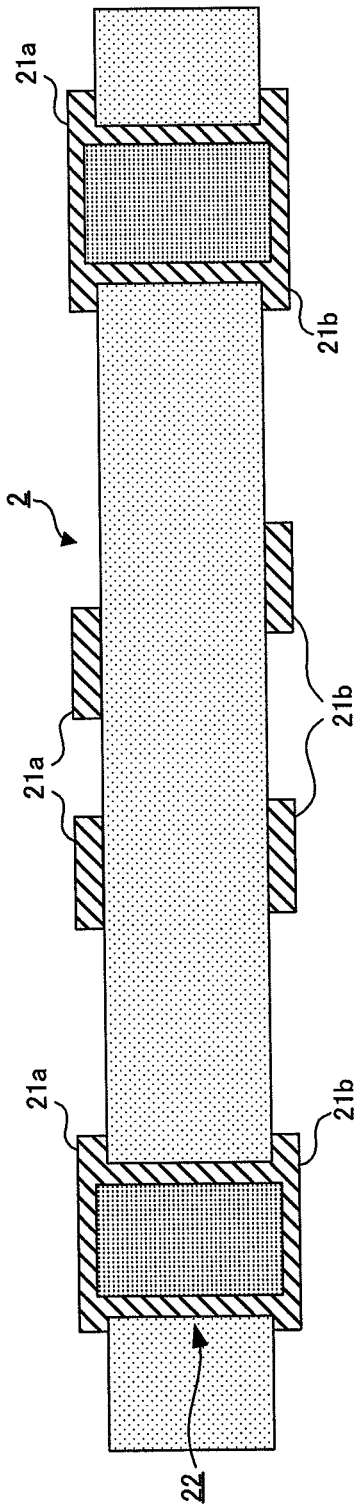

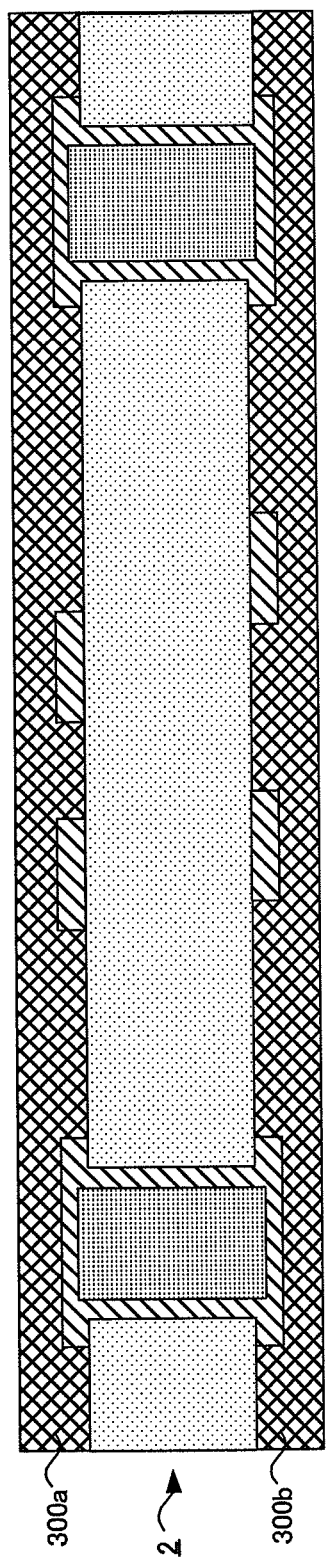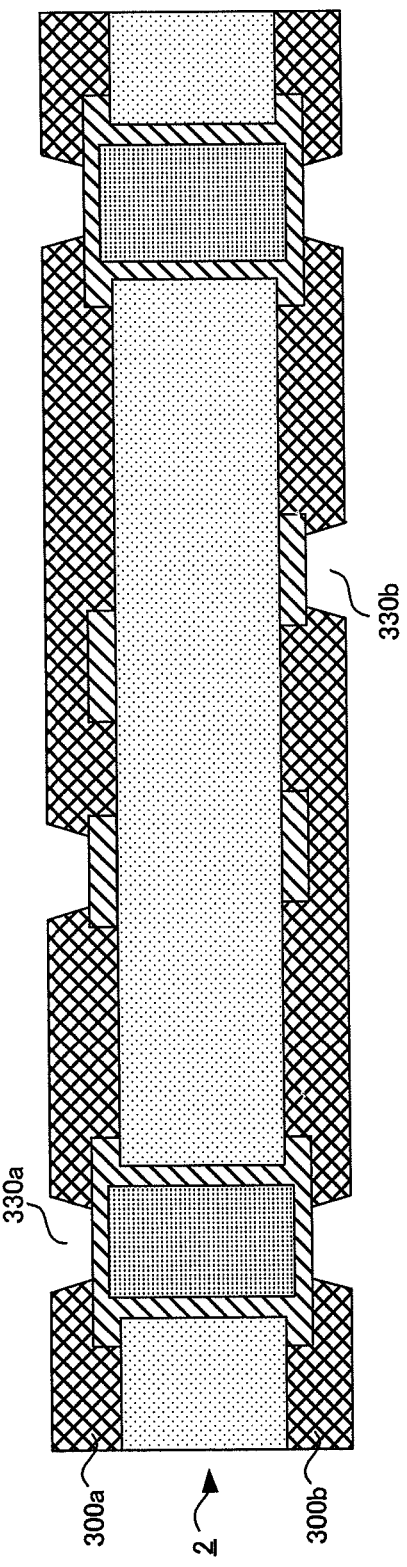

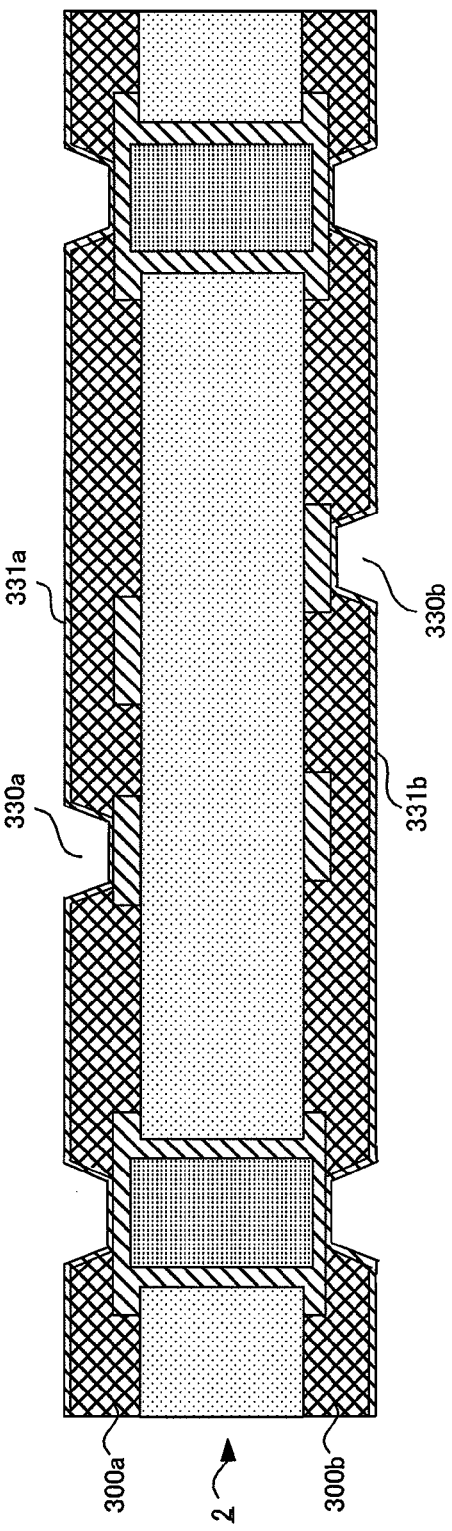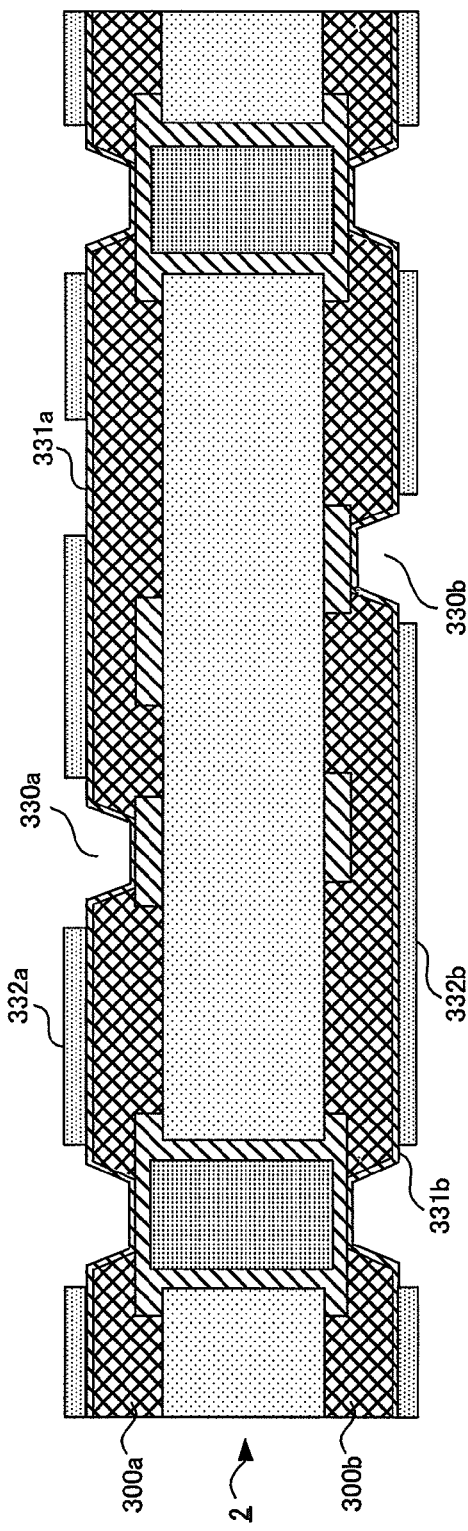

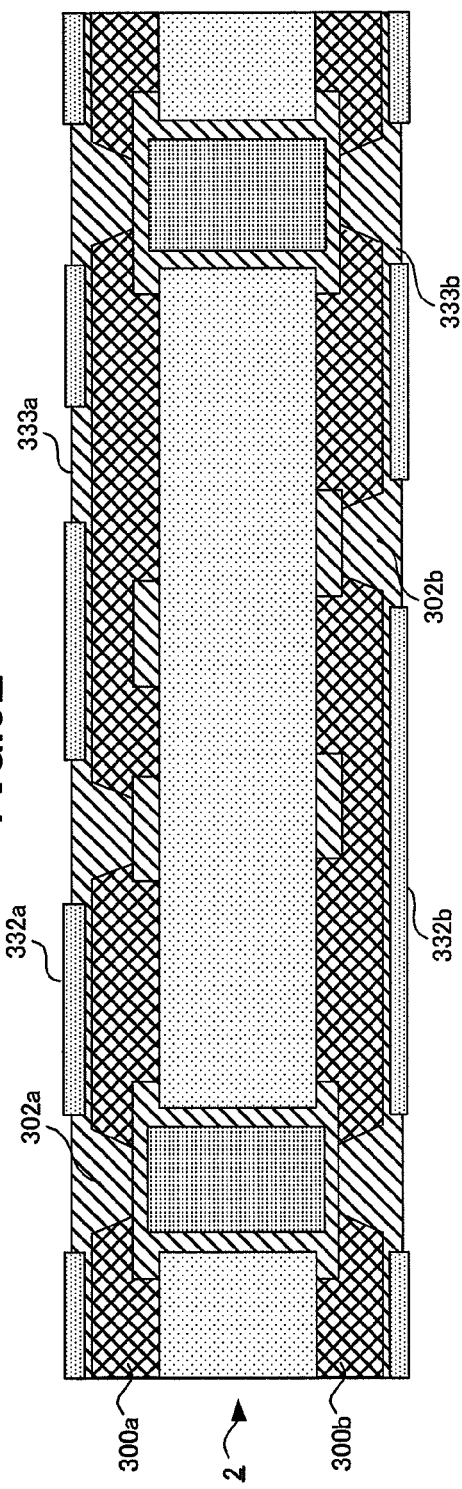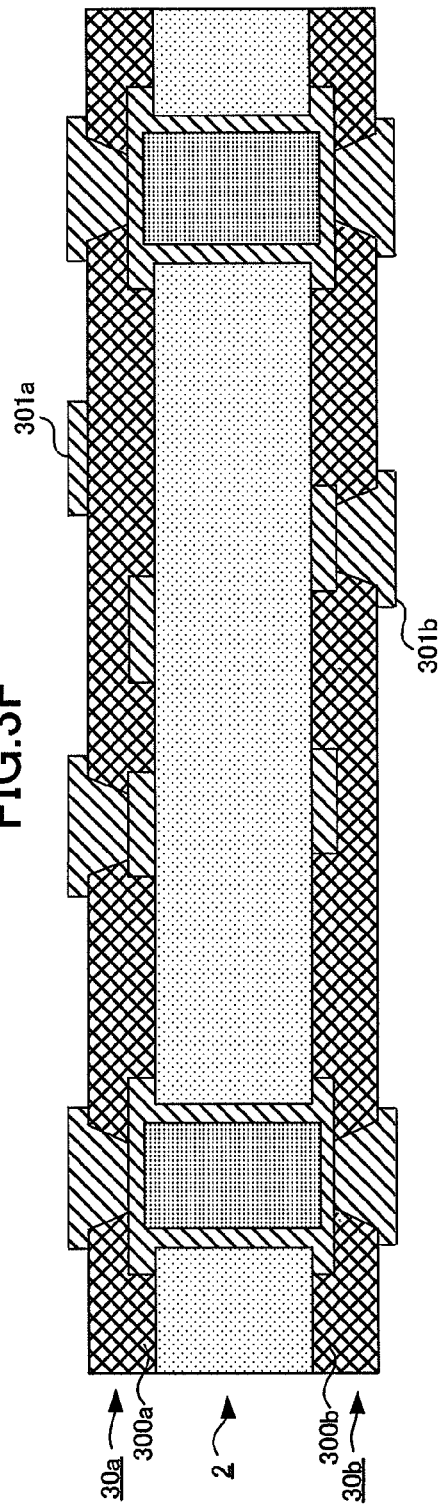

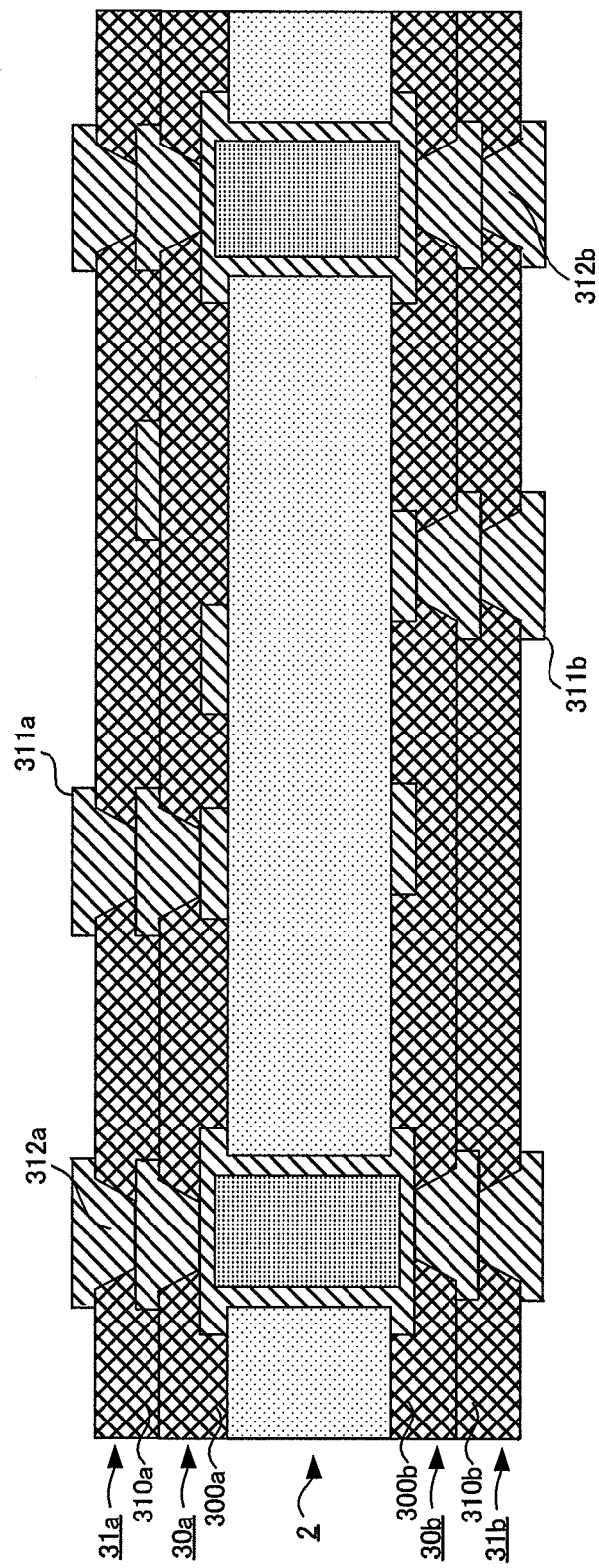

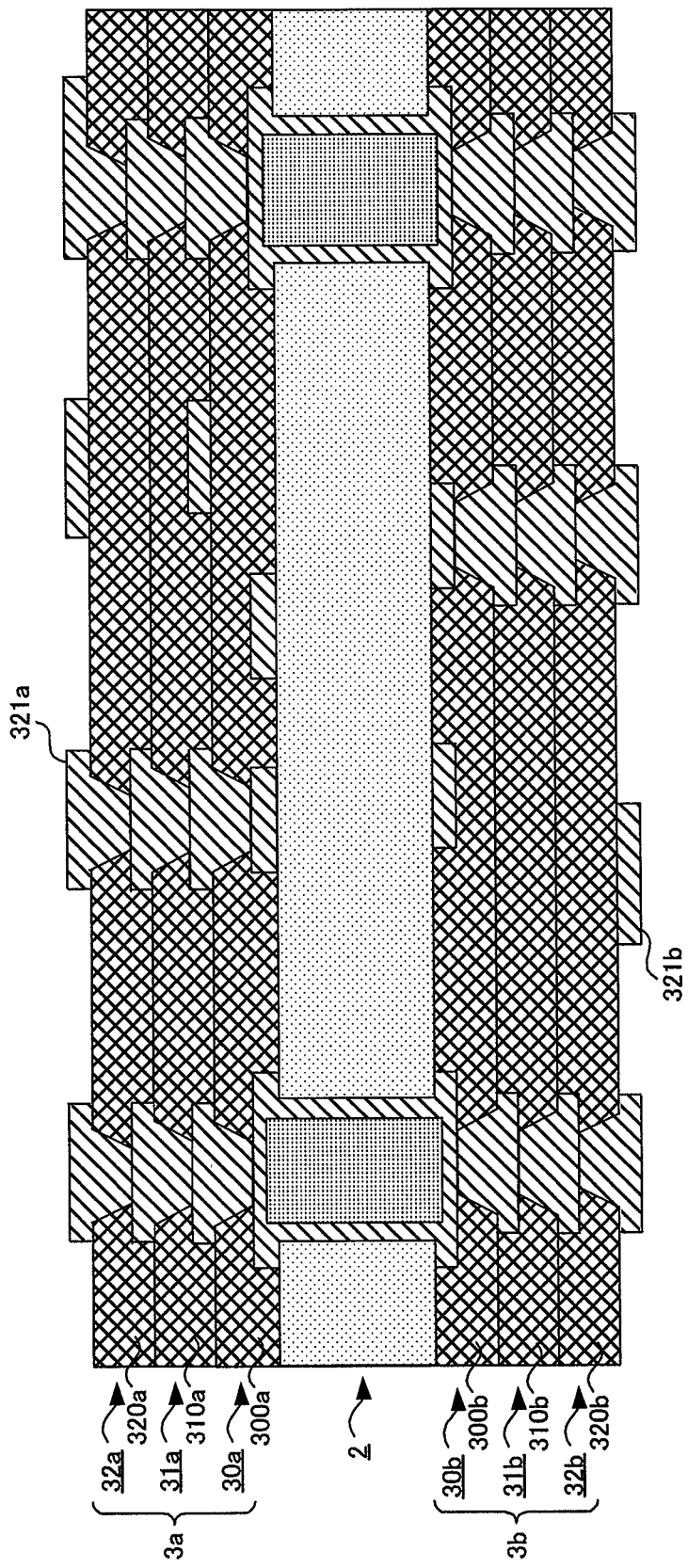

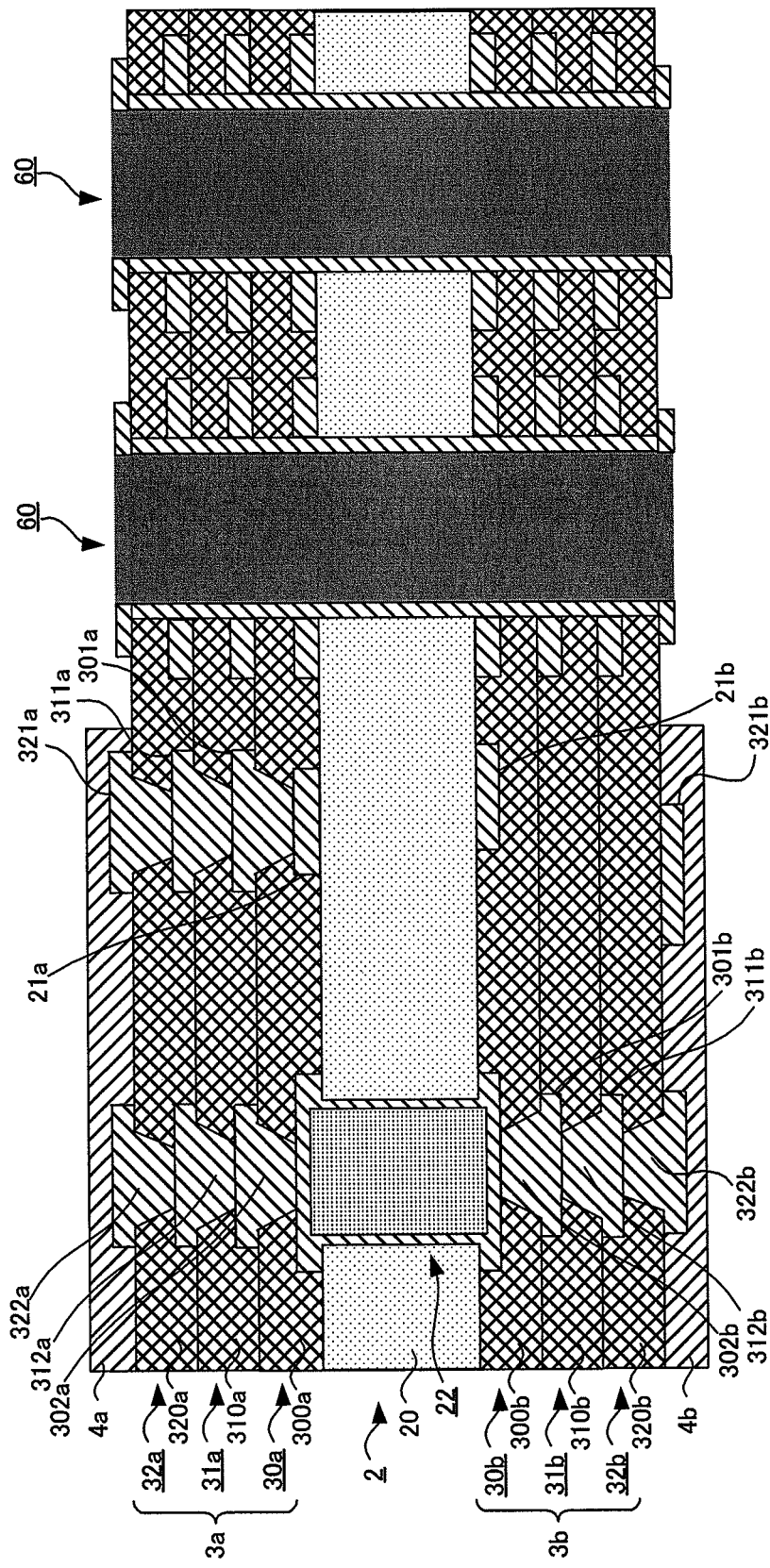

US 8,710,374 B2

PRINTED WIRING BOARD WITH REINFORCED INSULATION LAYER AND MANUFACTURING METHOD THEREOF

CROSS-REFERENCE TO RELATED APPLICATIONS

This patent application claims the benefit of U.S. Provisional Patent Application No. 61/035,951, filed Mar. 12, 2008, which is incorporated by reference.

BACKGROUND OF THE INVENTION

In recent years, electronic devices have become highly functional and compact. Accordingly, printed wiring boards that are highly functional and integrated are desirable. A build-up multilayer printed wiring board is designed to achieve a higher wiring density and integration. This type of wiring board can be formed by forming conductive circuits on a substrate and alternately laminating insulation layers and conductive layers on the substrate. The insulation layers can be made of resin such as polyimide resin and formed by applying a solution containing the resin to a substrate and curing the coating to form the insulation layer. However, the strength and rigidity of the wiring board having insulation layers made of resin may be insufficient, and thus stresses exerted from outside (for example, heat, impact from vibration, impact from being dropped or the like) may cause bending or warping in the entire wiring board.

BRIEF SUMMARY OF THE INVENTION

The invention provides a method of manufacturing a printed wiring board. In a method according to one embodiment of the present invention, a core substrate having an insulation substrate and a conductive circuit formed on the insulation substrate is provided. An inner insulation layer is formed on the core substrate. A surface of the inner insulation layer is treated to form a roughened portion on the surface. An outer insulation layer including a reinforcing material is formed on the surface of the inner insulation layer having the roughened portion.

The invention also provides a multilayer printed wiring board having a core substrate, an inner insulation layer and an outer insulation layer. The core substrate has an insulation substrate and a conductive circuit provided on the insulation substrate. The inner insulation layer is provided on the core substrate and has a surface having a roughened portion. The outer insulation layer including a reinforcing material is provided on the surface of the inner insulation layer having the roughened portion.

BRIEF DESCRIPTION OF THE SEVERAL VIEWS OF THE DRAWING(S)

FIGS. 2A-2F are cross-sectional views of the multilayer printed wiring board being manufactured by a method according to one embodiment of the present invention.

FIGS. 3A-3H are cross-sectional views of the multilayer printed wiring board being manufactured by the method.

FIG. 6 is a cross-sectional view showing a multilayer printed wiring board according to another embodiment of the present invention.

DETAILED DESCRIPTION OF THE INVENTION

Figure 1:
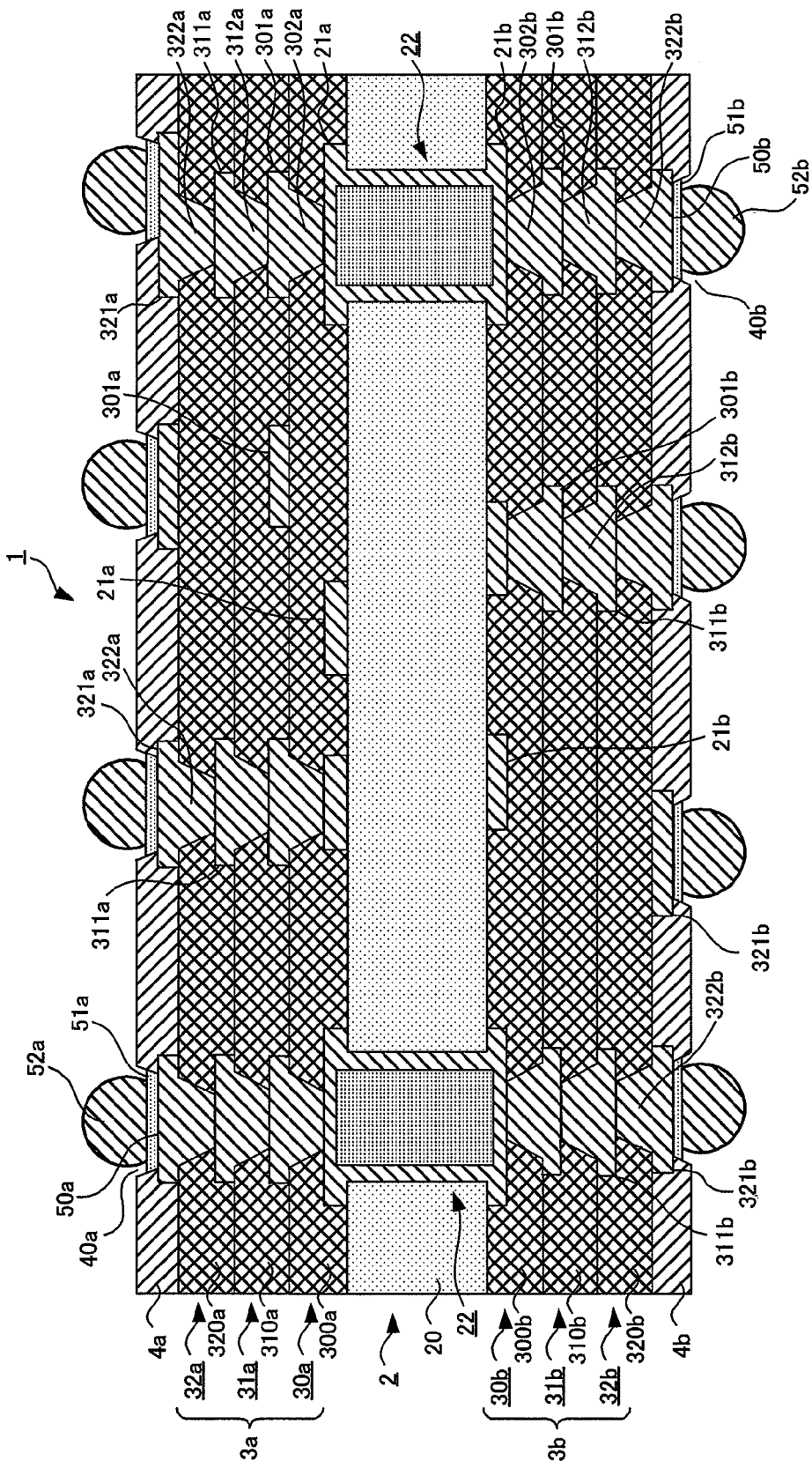
FIG. 1 is a cross-sectional view of a multilayer printed wiring board according to one embodiment of the present invention.

FIG. 1 is a cross-sectional view schematically showing a multilayer printed wiring board 1 according to one embodiment of the present invention. The multilayer printed wiring board 1 has a core substrate 2, build-up layer structures (3a, 3b) and solder-resist layers (4a, 4b). Hereinafter, the bottom surface of a layer or a substrate in the drawings is referred to as the first surface, and the top surface thereof is referred to as the second surface. As shown in FIG. 1, the build-up layer structure (3b) is provided on the first surface of the core substrate 2, and the build-up layer structure (3a) is provided on the second surface of the core substrate 2. The solder-resist layer (4b) is placed on the first surface of the build-up layer structure (3b), and the solder-resist layer (4a) is placed on the second surface of the build-up layer structure (3a). In the solder resist layers (4a, 4b), multiple opening portions (40a, 40b) are formed to provide solder-joint layers (51a, 51b) and solder bumps (52a, 52b). Multilayer printed wiring board 1 is electrically connected by the solder bumps (52a, 52b) to an electronic component such as an IC chip, or to a daughter board or the like.

Core substrate 2 has an insulation substrate 20 and conductive circuits (21a, 21b) provided on the first and second surfaces of the insulation substrate 20. Insulation substrate 20 is an insulative board that can be made by, for example, impregnating a base material such as glass cloth with epoxy resin or the like. The insulation substrate 20 can have a thickness in the range of, for example, about 60 μm to about 600 μm.

The core substrate 2 is a base substrate for forming build-up layers thereon as described below and functions as a core material in a build-up multilayer printed wiring board. As shown in FIG. 1, the core substrate 2 is desirably positioned substantially in the center portion of the build-up multilayer printed wiring board 1 in the thickness direction. The number of the build-up layers on each side of the core substrate 2 can be the same or different.

Conductive circuits (21a, 21b) include conductive material such as copper and have a thickness of, for example, about 5 μm to about 25 μm. Conductive circuits (21a) positioned on the second surface (top surface) of the insulation substrate 20 and conductive circuits (21b) positioned on the first surface (bottom surface) of the insulation substrate 20 are electrically connected by through-hole conductors 22.

In the illustrated embodiment, build-up layer structure (3a) is provided on the second surface of the core substrate 2 and has first layer (30a), second layer (31a) and third layer (32a) positioned in this order. First layer (30a) includes insulation layer (300a) and conductive circuit (301a), second layer (31a) includes insulation layer (310a) and conductive circuit (311a), and third layer (32a) includes insulation layer (320a) and conductive circuit (321a). Build-up layer structure (3b) is provided on the first surface of the core substrate 2 and has first layer (30b), second layer (31b) and third layer (32b). First layer (30b) includes insulation layer (300b) and conductive circuit (301b), second layer (31b) includes insulation layer (310b) and conductive circuit (311b), and third layer (32b) includes insulation layer (320b) and conductive circuit (321b). Among the insulation layers, the outer insulation layer (insulation layer (320a, 320b)) is desirably made more rigid than inner insulation layers (insulation layers (300a, 300b, 310a, 310b)).

Insulation layer (300a) of the first layer (30a) can contain a thermosetting resin and a thermoplastic resin. Preferably, the insulation layer (300a) also contains a rubber material. Additionally, the insulation layer (300a) desirably contains an inorganic additive. The thickness of insulation layer (300a) is in the range of, for example, about 20 µm to about 100 µm. Insulation layer (310a) of the second layer (31a) can, if desired, have the same material and/or thickness as insulation layer (300a).

Conductive circuit (301a) is formed on the second surface of insulation layer (300a). Conductive circuit (301a) contains a conductive material such as copper and has a thickness of, for example, about 5 µm to about 25 µm. Conductive circuit (311a) can have the same material and/or thickness as conductive circuit (311a).

Conductive circuit (301a) and conductive circuit (21a) are electrically connected by via conductor (302a), and conductive circuit (311a) and conductive circuit (301a) are electrically connected by via conductor (312a). Via conductors (302a, 312a) are filled vias made by filling via holes with a conductive material such as copper.

Third layer (32a) includes insulation layer (320a) and conductive circuit (321a). Insulation layer (320a) can be a board made of insulative material such as resin. The insulation layer (320a) is made rigid and contains a reinforcing material such as fiber. For example, the insulation layer (320a) can be prepared by impregnating glass cloth with epoxy resin. The thickness of insulation layer (320a, 320b) can be in the range of, for example, about 20 µm to about 100 µm.

Conductive circuit (321a) is formed on a second surface of insulation layer (320a). Conductive circuit (321a) contains a conductive material such as copper and can have a thickness of about 5 µm to about 25 µm. Conductive circuit (321b) is formed on a first surface of insulation layer (320b) and can have the same material and thickness as the conductive circuit (321a). Conductive circuit (321a) and conductive circuit (311a) are electrically connected by via conductors (322a), and conductive circuit (321b) and conductive circuit (311b) are electrically connected by via conductors (322b). The via conductors (322a, 322b) are filled vias.

Portions of conductive circuit (321a) are used as solder pads (50a). In solder resist layer (4a) covering conductive circuit (321a), multiple opening portions (40a) are formed to expose solder pads (50a). Solder-joint layer (51a) is formed on solder pad (50a) to enhance solderability, and solder bump (52a) is formed on solder-joint layer (51a).

In the illustrated embodiment, on the bottom surface (first surface) of the core substrate 2, a similar build-up structure is provided as shown in FIG. 1. First layer (30b), second layer (31b) and third layer (32b) form the build-up layer structure (3b). Insulation layer (300b) of the first layer (30b) can contain a thermosetting resin and a thermoplastic resin. Preferably, the insulation layer (300b) also includes rubber material. Further, the insulation layer (300b) desirably contains an inorganic additive. The thickness of insulation layer (300b) can be in the range of, for example, about 20 µm to about 100 µm. Insulation layer (310b) of the second layer (31b) can have the same material and/or thickness as insulation layer (300b).

Conductive circuit (301b) is formed on the first surface of insulation layer (300b). Conductive circuit (301b) contains conductive material such as copper and can have a thickness of, for example, about 5 µm to about 25 µm. Conductive circuit (311b) can have the same material and thickness as insulation layer (301b).

Conductive circuit (301b) and conductive circuit (21b) are electrically connected by via conductor (302b). Conductive circuit (311b) and conductive circuit (301b) are electrically connected by via conductor (312b). Via conductors (302b, 312b) are filled vias made by filling via holes with conductive material such as copper.

Third layer (32b) includes insulation layer (320b) and conductive circuit (321b). Insulation layer (320b) can be a board made of insulative material such as resin. Desirably, insulation layer (320b) is made rigid and contains a reinforcing material such as fiber. The insulation layer (320b) can be prepared by, for example, impregnating glass cloth with epoxy resin. The thickness of insulation layer (320b) can be in the range of, for example, about 20 µm to about 100 µm.

Conductive circuit (321b) formed on the first surface of insulation layer (320b) contains conductive material such as copper and can have a thickness of, for example, about 5 µm to about 25 µm. Conductive circuit (321b) and conductive circuit (311b) are electrically connected by via conductors (322b). The via conductors (322b) are filled vias.

In the illustrated embodiment, portions of conductive circuit (321b) are used as solder pads (50b). In solder resist layer (4b) covering conductive circuit (321b), multiple opening portions (40b) are formed to expose solder pads (50b). Solder-joint layer (51b) is formed on solder pad (50b) to enhance solderability, and solder bump (52b) is formed on solder-joint layer (51b).

As shown in FIG. 6, through-holes 60 can be formed to penetrate the entire multilayer printed wiring board. The multilayer printed wiring board having the through-holes 60 can be electrically connected to a component having insertion-type terminals.

With reference to FIG. 2A through FIG. 5, an embodiment of a method for manufacturing multilayer printed wiring board 1 is described.

(1) Core Substrate 2

FIG. 2A shows a cross section of a base substrate 200. The base substrate 200 is prepared by, for example, laminating metal films (201a, 201b) on an insulation substrate 20. For example, the base substrate 200 can be a copper-clad laminate prepared by laminating a copper film with a desired thickness (for example, approximately 25 µm) on both main surfaces of insulation substrate 20 having a thickness in the range of, for example, about 60 µm to about 600 µm. As the insulation substrate 20, for example, an epoxy-resin laminate made with flame-retardant glass base material whose FR (Flame Retardant) grade is four (4) (FR-4) can be used. Another example of the insulation substrate 20 may be a rigid board material produced by impregnating glass cloth with BT (bismaleimide triazine) resin, polyphenylene ether resin, etc., or by impregnating aramid non-woven fabric with epoxy resin, imide resin or the like.

As shown in FIG. 2B, through-holes 202 are formed in the base substrate 200. The through-holes 202 can be formed by a suitable boring method using a drill or the like.

Figure 2C:
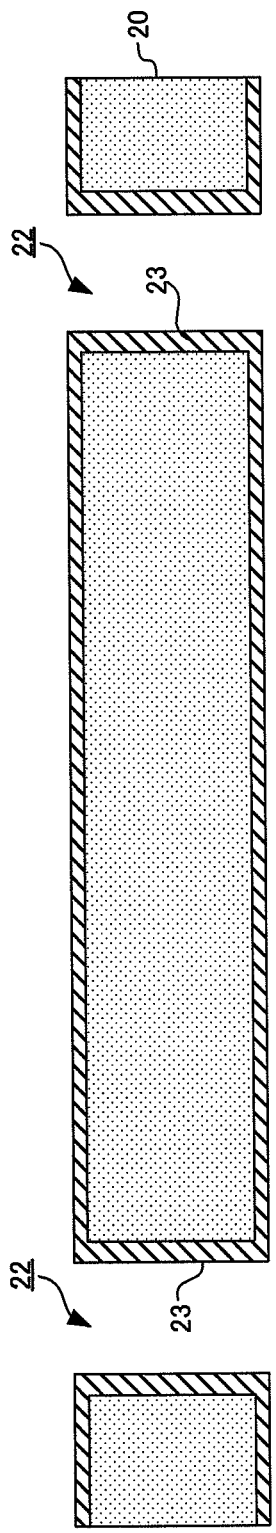

After forming through-holes 202, through-hole conductors 23 are formed on the surface of the base substrate 200 including the walls inside the through-holes 202 (see FIG. 2C). The through-hole conductors 23 can be formed by, for example, performing an electroless copper plating treatment and an electrolytic copper plating treatment.

Figure 2D:
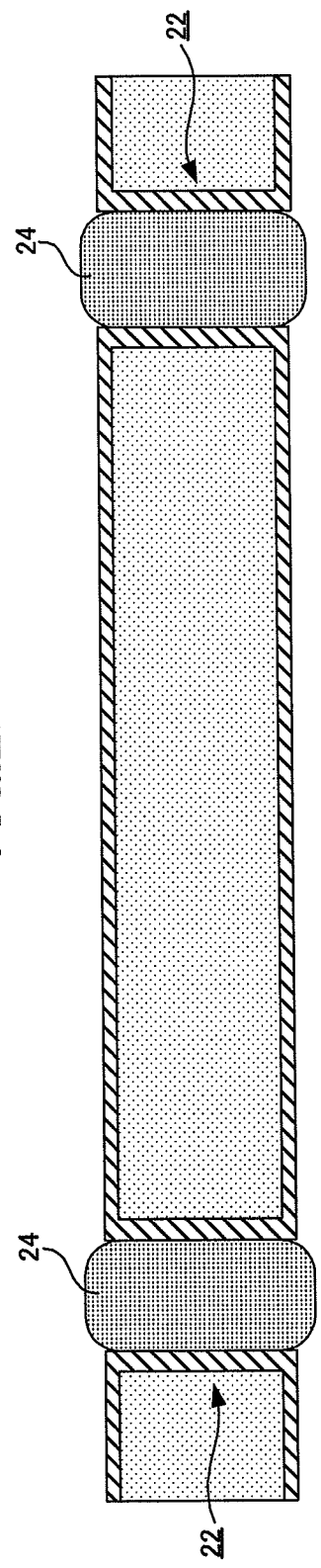

In the space inside through-holes 22, a filling agent 24 is provided, dried and cured (see FIG. 2D). A suitable method such as screen printing can be employed to fill the filling agent 24. Subsequently, the surfaces of the base substrate 200 are polished to remove filling agent 24 protruding from the surfaces and level the surfaces of the base substrate 200. Conductive layers (203a, 203b) are formed on the leveled surfaces by, for example, performing an electroless copper plating treatment and an electrolytic copper plating treatment (see FIG. 2E).

Subsequently, by using a tenting method, conductive layers (203a, 203b) are patterned to form conductive circuits (21a, 21b), thereby obtaining a core substrate 2 (see FIG. 2F).

2) Build-Up Layers (3a, 3b)

A) First Layers (30a, 30b)

Insulation layers (300a, 300b) are formed by, for example, laminating resin material in a film state on the first and second surfaces of core substrate 2 (see FIG. 3A). Also, the insulation layers (300a, 300b) can be formed by coating a resin material in a liquid form onto the surfaces of the core substrate 2. The resin material for the insulation layers (300a, 300b) can include a thermosetting resin and a thermoplastic resin. Preferably, the insulation layers (300a, 300b) also include a rubber material. Further, the insulation layers (300a, 300b) desirably contain an inorganic additive. The thermosetting resin is desirably epoxy resin, imide resin, BT resin or a mixture thereof. The thermoplastic resin is desirably phenoxy resin or polyvinyl acetal resin. As for the rubber material, polybutadiene rubber or polybutadiene derivatives can be used.

Since the rubber material and the inorganic additive have different thermal expansion rates (thermal expansion coefficients), the surface of insulation layers (300a, 300b) formed by the above lamination can be finely roughened.

After forming the insulation layers (300a, 300b), vias (or blind holes) (330a, 330b) are formed in the insulation layers (300a, 300b) (see FIG. 3B). For example, carbon dioxide ($CO_2$) gas laser, UV-YAG laser or the like can be used to form the vias (330a, 330b).

Then, a desmear treatment is applied to remove smearing or the like remaining at the bottom of the vias (330a, 330b). The desmear treatment roughens the surfaces of the insulation layers (300a, 300b), and thus an additional roughening treatment can be omitted. After the desmear treatment, the surfaces of insulation layers (300a, 300b) roughened due to the difference in thermal expansion of the ingredients can be further roughened. The desmear treatment can be performed by using, for example, a permanganate method as follows. The core substrate 2 shown in FIG. 3B is first subjected to a conditioning (resin swelling) treatment and then immersed in a desmear treatment solution containing permanganate of 40-80 g/l at a temperature of 50-80° C. for approximately 5-20 minutes. The core substrate 2 is washed with water, immersed in a neutralizer solution, washed with water and dried. Alternatively, the surfaces of the insulation layers (300a, 300b) can be processed by a plasma desmear treatment.

As described above, the insulation layers (300a, 300b) contain a rubber material. Therefore, during the above desmear treatment (the roughening treatment), the rubber material near the surface of insulation layers (300a, 300b) is dissolved, while the inorganic additive remains near the surface of the insulation layers (300a, 300b). Accordingly, the surface of insulation layer (300a, 300b) (including the inner surfaces of vias (330a, 330b)) is made rough, which is more preferable to achieve an anchoring effect than in a case in which a rubber material is not contained.

After the desmear treatment, the substrate is immersed in a catalytic solution or colloid containing catalyst such as tin-palladium complex salt. The catalyst for starting the electroless plating is adhered to the surface of insulation layer (300a, 300b).

Subsequently, by immersing the substrate with the adhered catalyst in an electroless plating solution (such as electroless copper plating solution), electroless plated film (331a, 331b) is formed on the surface of insulation layer (300a, 300b) (see FIG. 3C). The electroless plated film (331a, 331b) can have a thickness of approximately 0.2 µm.

The surface of insulation layer (300a, 300b) is roughened as described above, which is more effective in achieving an anchoring effect. Thus, insulation layer (300a, 300b) and electroless plated film (331a, 331b) are more firmly adhered to each other.

Subsequently, plating resist layer (332a, 332b) is formed on the electroless plated film (331a, 331b). The plating resist layer (332a, 332b) can be formed by, for example, laminating a photosensitive resist in a dry film state on the surface of the plating resist layer (332a, 332b), attaching a mask film with a predetermined pattern to each photosensitive resist, and subjecting the board to exposure to ultraviolet rays and development in an aqueous alkaline solution. The plating resist layer (332a, 332b) is formed to have openings to form conductive circuits (see FIG. 3D).

After the board shown in FIG. 3D is washed with water and dried, an electrolytic plating is performed to form electrolytic plated layer (333a, 333b) in the opening portions of plating resist layer (332a, 332b) (see FIG. 3E). The electrolytic plated layer (333a, 333b) can be an electrolytic copper-plated layer with a thickness of about 5 µm to about 35 µm. In this process, the vias (330a, 330b) are filled with plating to form via conductors (302a, 302b).

Then, the plating resist layer (332a, 332b) is removed. After the board is washed with water and dried, the electroless plated film (331a, 331b) being exposed is etched away. As a result, the board having conductive circuits (301a, 301b) is obtained as shown in FIG. 3F.

B) Second Layers (31a, 31b)

The second layers (31a, 31b) including insulation layer (310a, 310b) and conductive circuits (311a, 311b) are formed similarly to the first layers (30a, 30b) (see FIG. 3G).

C) Third Layers (32a, 32b)

As shown in FIG. 3H, third layer (32a, 32b) is formed on the second layer (31a, 31b). The third layer (32a, 32b) is formed similarly to the first layers (30a, 30b), except for using material different from the material used for the first layer (30a, 30b) and second layer (31a, 31b). Third layer (32a, 32b) includes insulation layer (320a, 320b) and conductive circuit (321a, 321b). For the insulation layer (320a, 320b), resin material reinforced with fiber is desirably used. Examples of the reinforcing material include glass non-woven fabric and aramid non-woven fabric, and examples of the resin material include BT resin, polyphenylene ether resin and imide resin. Also, as the insulation layer (320a, 320b), epoxy-resin laminate (FR-4) with flame-retardant glass base material can be used.

The insulation layer (320a, 320b) of the third layer (32a, 32b) contains fabric, whereas the insulation layer (310a, 310b) of the second layer (31a, 31b) does not contain fiber or fabric. As such, the two insulation layers in contact with each other are expected to have different thermal expansion coefficients, which could impair the adhesion between the layers. However, the insulation layers in the multilayer printed wiring board 1 of the present embodiment are firmly adhered to each other because of the surface roughness of the insulation layer (310a, 310b) of the second layer (31a, 31b).

(3) Solder-Resist Layer (4a, 4b)

Figure 4A:
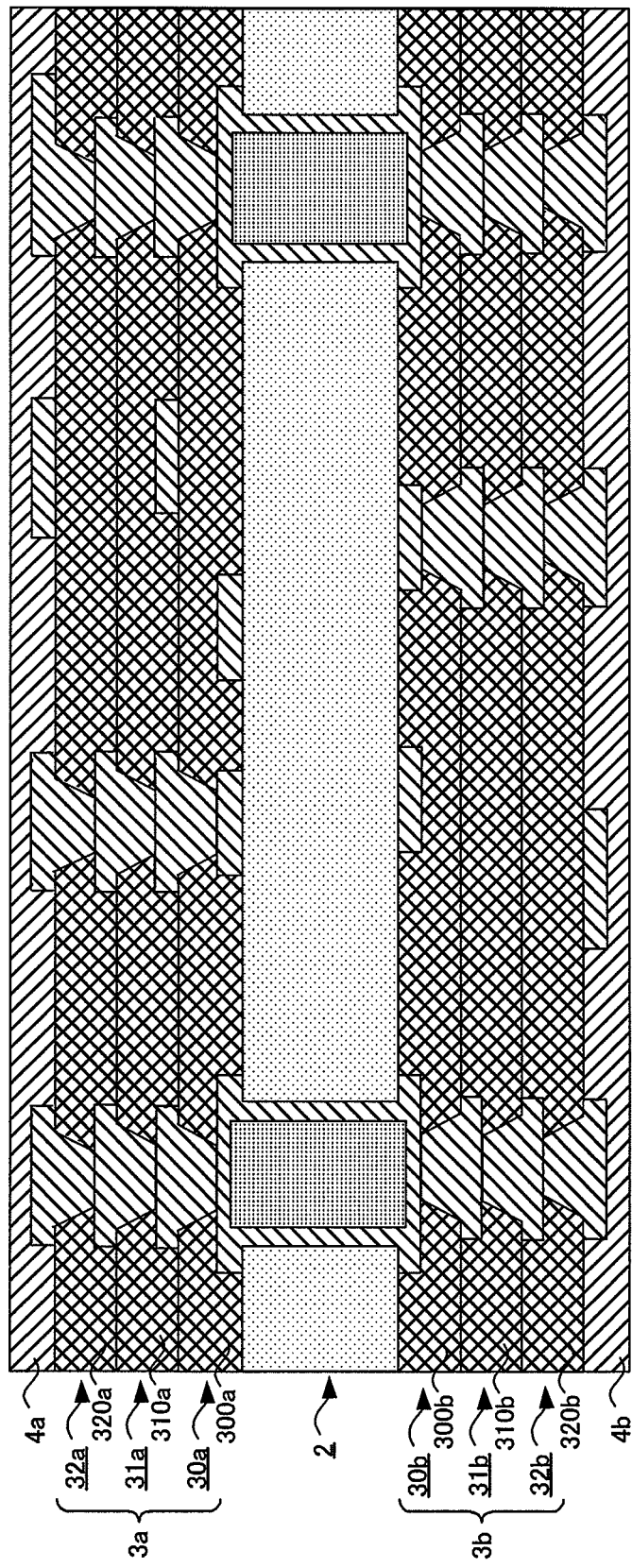
FIGS. 4A and 4B are cross-sectional views of the multilayer printed wiring board being manufactured by the method.
Figure 4B:
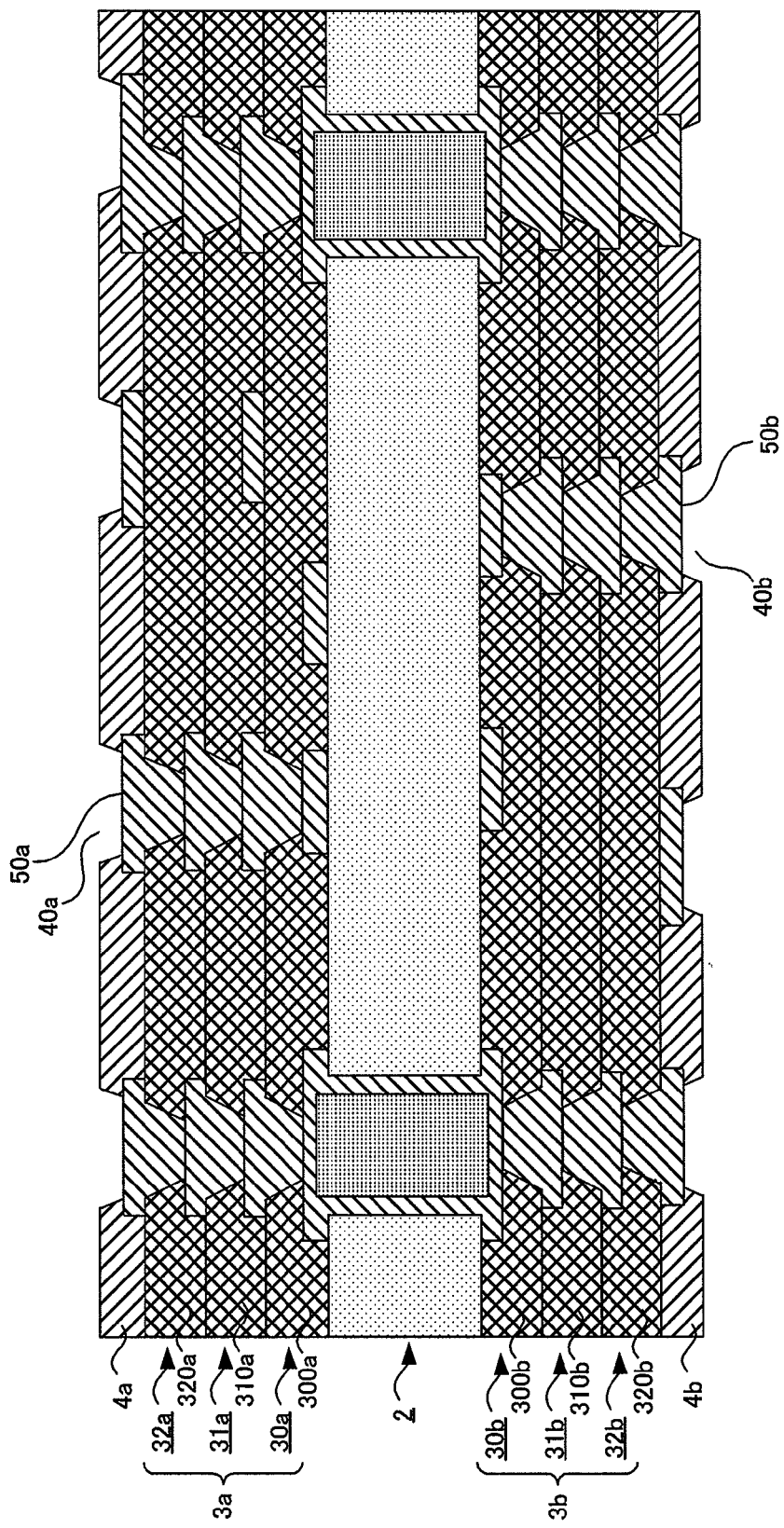

As shown in FIG. 4A, solder-resist layer (4a, 4b) is formed on the insulation layer (320a, 320b). The solder-resist layer (4a, 4b) can be formed by either applying or laminating a photosensitive resist (solder resist) in a liquid or dry-film state on the surfaces of the insulation layer (320a, 320b). The thickness of the solder-resist layer (4a, 4b) can be about 5 μm to about 50 μm.

Then, a mask film with a predetermined pattern is attached to the surface of solder-resist layer (4a, 4b), which is then exposed to ultraviolet rays and developed by using, for example, an alkaline solution. As a result, opening portions (40a, 40b) exposing the portions of the conductive circuit (321a, 321b) are formed in solder-resist layer (4a, 4b). The exposed portions are used as solder pads (50a, 50b) (see FIG. 4B).

(4) Surface Treatment

Figure 5:
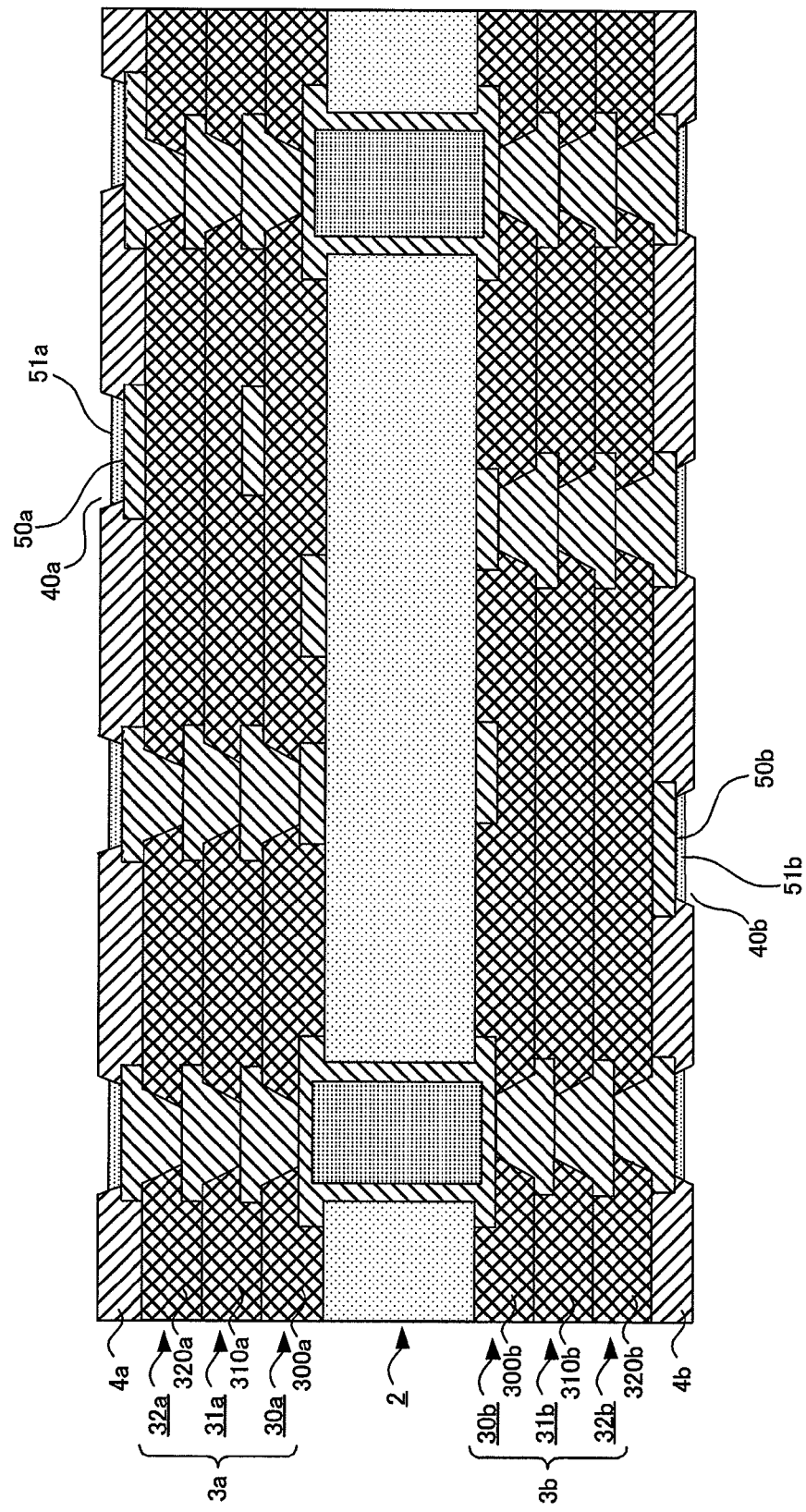
FIG. 5 is a cross-sectional view of the multilayer printed wiring board being manufactured by the method.

Solder-joint layer (51a, 51b) is then formed on solder pad (50a, 50b) (see FIG. 5). Solder-joint layer (51a, 51b) is a plated layer to enhance solderability. The solder-joint layer (51a, 51b) can have a multi-layered structure, for example, including a nickel-plated layer and a gold-plated layer. The thickness of the nickel-plated layer and the gold-plated layer can be about 1 μm to about 5 μm and about 0.01 μm to about 1 μm, respectively. The nickel-plated layer and the gold-plated layer can be formed by immersing the board in an electroless nickel plating solution and in an electroless gold plating solution. Alternatively, solder-joint layer (51a, 51b) can have a three-layer structure (such as nickel-palladium-gold plated layers) or a single plated layer containing gold, silver, tin or the like. Also, the solder-joint layer (51a, 51b) can be a resin film containing flux.

Subsequently, by printing solder paste on solder-joint layers (51a, 51b) and conducting a reflow process, solder bumps (52a, 52b) are formed to obtain multilayer printed wiring board 1 (see FIG. 1). Multilayer printed wiring board 1 is electrically connected to electronic components such as an IC chip, or to a daughter board or the like by solder bumps (52a, 52b).

As described above, the multilayer printed wiring board 1 is manufactured by a build-up method. In providing build-up layer structures (3a, 3b), the materials used for the insulation layers are desirably selected. In this embodiment, the material for the inner insulation layers of first layer (30a, 30b) and second layer (31a, 31b) have properties different from the material for an outer insulation layer of third layer (32a, 32b). The inner insulation layers (300a, 300b, 310a, 310b) of first layers (30a, 30b) and second layers (31a, 31b) are formed by using resin material free from a reinforcing material such as fiber material or fabric like glass cloth. Accordingly, fine patterns can be easily provided to achieve higher density. Here, the term "free" regarding the reinforcing material in the inner insulation layers means that the reinforcing material is not contained in such an amount as to increase rigidity of the inner insulation layers. The insulation layers (300a, 300b, 310a, 310b) have surfaces that are made rough after a desmear treatment (also a roughening treatment), which achieves a desirable anchoring effect. Accordingly, the insulation layers (300a, 300b, 310a, 310b) and conductive circuits (301a, 301b, 311a, 311b) formed on the respective surfaces are firmly bonded to each other.

The outer insulation layers (320a, 320b) of third layers (32a, 32b) in build-up layer structures (3a, 3b) are formed by using resin material containing a reinforcing material such as fiber or fabric like glass cloth. Namely, multilayer printed wiring board 1 has a structure in which the inner insulation layers (300a, 300b, 310a, 310b) are sandwiched between more rigid layers, that is, the core substrate 2 and the outer insulation layers (320a, 320b). Accordingly, the inner layers are effectively protected against stress exerted from outside (such as heat, impact from vibration, impact from the drop or the like). Therefore, warping and bending of the wiring board due to external stresses is suppressed.

In addition, the outer insulation layer (insulation layer (320a, 320b)) is formed on the roughened surface of inner insulation layer (insulation layer (310a, 310b)), and thus the insulation layers are firmly fixed to each other.

Besides the embodiments described above, the present invention contemplates various modifications. The multilayer printed wiring board 1 according to the above embodiment has a structure in which the inner insulation layer of build-up layer structures (3a, 3b) has two layers (first layer (30a, 30b) and second layer (31a, 31b)). However, the inner insulation layer can be a single layer or can have any number of layers. Also, the outer insulation layer of the build-up layers is not limited to one layer (third layer (32a, 32b)) but can have more than one layers.

Furthermore, the multilayer printed wiring board 1 of the above embodiment is provided with build-up layers (3a, 3b) having the same number of layers on each surface of core substrate 2, but the number of layers may be different from each other. For example, the build-up layer (3a) can have two insulation layers, while the build-up layer (3b) can have three insulation layers. Alternatively, the build-up layers may be formed only on one surface.

Also, the solder pads for connection to an electronic component can be provided only on one of the surfaces of the multilayer printed wiring board 1.

As described above, a multilayer printed wiring board that enables formation of fine patterns and prevents bending and warping to the greatest extent possible is provided. In one embodiment, a multilayer printed wiring board is structured with a core substrate; an inner-layer insulation layer which is formed on the core substrate and contains thermosetting resin, thermoplastic resin and inorganic additive; and an outer-layer insulation layer formed on the inner-layer insulation layer and reinforced with fiber. The wiring board desirably has a surface of the inner-layer insulation layer being roughened, and the outer-layer insulation layer is formed on the roughened surface of the inner-layer insulation layer.

A method for manufacturing a printed wiring board desirably has the processes of forming a core substrate; forming on the core substrate an inner-layer insulation layer containing thermosetting resin, thermoplastic resin and inorganic additive; roughening a surface of the inner-layer insulation layer; and forming an outer-layer insulation layer reinforced with fiber on the roughened surface of the inner-layer insulation layer.

Preferably, fiber is not contained in the inorganic additive. On the other hand, the fiber contained in the outer-layer insulation layer is preferred to be at least one of glass cloth, glass non-woven fabric and aramid non-woven fabric.

The thermosetting resin is preferred to be at least one of epoxy resin, imide resin and BT resin. The thermoplastic resin is preferred to be at least one of phenoxy resin and polyvinyl acetal resin.

A rubber material is preferred to be contained in the inner-layer insulation layer. The rubber ingredient is preferred to be at least one of polybutadiene rubber and polybutadiene derivatives.

The inorganic additive is preferred to be at least one of silica, silicon oxide, clay and talc.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A method for manufacturing a multilayer printed wiring board, comprising:
    providing a core substrate having an insulation substrate and a conductive circuit provided on the insulation substrate;
    forming a first inner insulation layer on a first surface of the core substrate;
    forming a second inner insulation layer on a second surface of the core substrate opposite to the first surface;
    roughening surfaces of the first inner insulation layer and the second inner insulation layer;
    forming a first outer insulation layer on the first inner insulation layer such that a first build-up structure comprising the first outer insulation layer and the first inner insulation layer provided between the first outer insulation layer and the core substrate is formed;
    forming a second outer insulation layer on the second inner insulation layer such that a second build-up structure comprising the second outer insulation layer and the second inner insulation layer provided between the second outer insulation layer and the core substrate is formed; and
    forming a solder-resist layer on at least one of the first outer insulation layer and the second outer insulation layer,
    wherein the insulation substrate, the first outer insulation layer and the second outer insulation layer comprise a reinforcing material, the first inner insulation layer and the second inner insulation layer are free from a reinforcing material, and the first build-up structure and the second build-up structure are formed such that the first and second build-up structures have a same number of insulation layers.

2. The method of claim 1, wherein the reinforcing material of the first outer insulation layer and the second outer insulation layer comprises at least one material selected from the group consisting of glass cloth, glass non-woven fabric and aramid non-woven fabric.

3. The method of claim 1, wherein the first inner insulation layer and the second inner insulation layer comprise thermosetting resin, thermoplastic resin and inorganic additive.

4. The method of claim 3, wherein the thermosetting resin comprises at least one material selected from the group consisting of epoxy resin, imide resin and bismaleimide triazine resin.

5. The method of claim 3, wherein the thermoplatic resin comprises at least one material selected from the group consisting of phenoxy resin and polyvinyl acetal resin.

6. The method of claim 3, wherein the inorganic additive comprises at least one material selected from the group consisting of silica, clay and talc.

7. The method of claim 1, wherein the first inner insulation layer and the second inner insulation layer are free from a fiber material.

8. The method of claim 1, wherein the first inner insulation layer and the second inner insulation layer comprise a rubber material.

9. The method of claim 8, wherein the rubber material comprises at least one material selected form the group consisting of polybutadiene rubber and polybutadiene derivatives.

10. The method of claim 1, wherein the roughening of the surfaces of the first inner insulation layer and the second inner insulation layer comprises treating the surfaces with a solution comprising permanganate.

11. The method of claim 1, further comprising:
    forming a first inner conductive circuit on a roughened surface of the first inner insulation layer;
    forming a second inner conductive circuit on a roughened surface of the second inner insulation layer;
    forming a first filled via in the first outer insulation layer such that the first filled via is electrically connected with the first inner conductive circuit; and
    forming a second filled via in the second outer insulation layer such that the second filled via is electrically connected with the second inner conductive circuit.

12. A multilayer printed wiring board, comprising:
    a core substrate having an insulation substrate and a conductive circuit provided on the insulation substrate, the core substrate having a first surface and a second surface opposite to the first surface;
    a first build-up structure provided on the first surface of the core substrate, the first build-up structure comprising a first inner insulation layer provided between a first outer insulation layer and the core substrate; and
    a second build-up structure provided on the second surface of the core substrate, the second build-up structure comprising a second inner insulation layer provided between a second outer insulation layer and the core substrate; and
    a solder-resist layer formed on at least one of the first outer insulation layer and the second outer insulation layer,
    wherein the insulation substrate, the first outer insulation layer and the second outer insulation layer comprise a reinforcing material, the first inner insulation layer and the second inner insulation layer are free from a reinforcing material, the first inner insulation layer and the second inner insulation layer have roughened surfaces, and the first build-up structure and the second build-up structure are formed such that the first and second build-up structures have a same number of insulation layers.

13. The multilayer printed wiring board of claims 12, wherein the reinforcing material of the first outer insulation layer and the second outer insulation layer comprises at least one material selected from the group consisting of glass cloth, glass non-woven fabric and aramid non-woven fabric.

14. The multilayer printed wiring board of claim 12, wherein the first inner insulation layer and the second inner insulation layer comprise thermosetting resin, thermoplastic resin and inorganic additive.

15. The multilayer printed wiring board of claim 14, wherein the thermosetting resin comprises at least one material selected from the group consisting of epoxy resin, imide resin and bismaleimide triazine resin.

16. The multilayer printed wiring board of claim 14, wherein the thermoplastic resin comprises at least one material selected from the group consisting of phenoxy resin and polyvinyl acetal resin.

17. The multilayer printed wiring board of claim 14, wherein the inorganic additive comprises at least one material selected from the group consisting of silica, clay and talc.

18. The multilayer printed wiring board of claim 12, wherein the first inner insulation layer and the second inner insulation layer are free from a fiber material.

19. The multilayer printed wiring board of claim 12, wherein the first inner insulation layer and the second inner insulation layer comprise a rubber material.

20. The multilayer printed wiring board of claim 19, wherein the rubber material comprises at least one material selected from the group consisting of polybutadiene rubber and polybutadiene derivatives.

21. The multilayer printed wiring board of claim 12, further comprising:
- a first inner conductive circuit formed on a roughened surface of the first inner insulation layer;
- a second inner conductive circuit formed on a roughened surface of the second inner insulation layer;
- a first filled via formed in the first outer insulation layer such that the first filled via is electrically connected with the first inner conductive circuit; and
- a second filled via formed in the second outer insulation layer such that the second filled via is electrically connected with the second inner conductive circuit.

* * * * *